United States Patent
Aulagner et al.

(10) Patent No.: US 7,235,162 B2
(45) Date of Patent: Jun. 26, 2007

(54) CATHODE FOR VACUUM SPUTTERING TREATMENT MACHINE

(75) Inventors: Michel Aulagner, St Ferreol d'Aurour (FR); Lionel Labalme, St Just St Rambert (FR)

(73) Assignee: Tecmachine, Andrezieux Boutheon (FR)

( * ) Notice: Subject to any disclaimer, the term of this patent is extended or adjusted under 35 U.S.C. 154(b) by 186 days.

(21) Appl. No.: 11/032,378

(22) Filed: Jan. 10, 2005

(65) Prior Publication Data

US 2005/0133366 A1 Jun. 23, 2005

Related U.S. Application Data

(63) Continuation of application No. PCT/FR03/02110, filed on Jul. 8, 2003.

(51) Int. Cl.
*C23C 14/34* (2006.01)
(52) U.S. Cl. .............................. 204/298.12; 204/298.09
(58) Field of Classification Search ........... 204/298.12, 204/298.13, 298.09
See application file for complete search history.

(56) References Cited

U.S. PATENT DOCUMENTS 4,780,190 A * 10/1988 Vranken et al. ....... 204/298.12
5,147,521 A    9/1992 Belli et al. ............. 204/298.12
5,269,894 A   12/1993 Kerschbaumer ....... 204/192.12
5,863,397 A    1/1999 Tu et al. ................ 204/298.12

FOREIGN PATENT DOCUMENTS

DE        295 12 094 U1    3/1996

* cited by examiner

*Primary Examiner*—Rodney G. McDonald
(74) *Attorney, Agent, or Firm*—Heslin Rothenberg Farley & Mesiti P.C.; Victor A. Cardona, Esq.

(57) ABSTRACT

A cathode for a vacuum sputtering processing machine includes a target plate mounted on a support having a cooler. The support is secured to a frame delimiting a closed space for positioning and centering the target. The frame peripherally has a profiled catching rim configured to collaborate with a set of independent gripping elements having complementary catching shapes configured to allow an effect of tilting of the elements resulting from a clamping action exerted on members engaged in a thickness of the elements, and bearing against a part of the catching rim of the frame, so that, under the tilting effect, a part of the catching shapes of the set of gripping elements bears facially against a peripheral edge of the target plate to secure the target plate.

11 Claims, 5 Drawing Sheets

CATHODE FOR VACUUM SPUTTERING TREATMENT MACHINE

CROSS-REFERENCE TO RELATED APPLICATIONS

This application is a continuation of International Application PCT/FR2003/02110 filed on Jul. 8, 2003 and published in French as International Publication WO 2004/008478 on Jan. 22, 2004, and claims priority from French patent application No. 02.08868 filed Jul. 10, 2002, the entire contents of these applications being incorporated herein by reference.

The invention relates to the technical field of cathode sputtering of a material particularly in a vacuum processing plant.

As far as the person skilled in the art is concerned, it is very well known practice to use cathodes to sputter a material from a target, in combination with an anode. In a conventional sputtering plant, the negative voltage is applied to the target that acts as a cathode during sputtering, while the positive voltage source is connected to a separate anode, for example in a vacuum treatment chamber.

The prior art can be illustrated, by way of nonlimiting indication, by the teachings of patent FR 2492163 which relates to a cathode arrangement for sputtering a material from a target in a sputtering plant. In this patent, the target comprises a support plate having arrangements for the circulation of a cooling fluid. The target is held in position by means of a peripheral bridge screwed into the thickness of the cooling plate and into the thickness of a base or end plate carrying the cooling plate. In general, a membrane is mounted between the target and the cooling plate.

In this type of plant, it is necessary to change the target very frequently, to suit the application.

As far as solutions of the prior art are concerned, whatever their embodiments the target-securing means do not allow the target to be handled and interchanged with ease.

Often the target is fixed by means of a plurality of screws arranged around the periphery. If one considers the very great number of screws needed to secure the target, it is obvious that the mounting and demounting time is particularly lengthy. Furthermore, risks of seizure may arise.

It has also been proposed for the target to be secured by means of facial clamping, in conjunction with screws. This solution is still not satisfactory given that, once again, it is the screws that contribute directly to the overall clamping of the target. A solution such as this emerges for example from the teachings of the aforementioned patent FR 2492163.

Mention may also be made of the teaching of U.S. Pat. No. 5,269,894 which discloses a cathode for a vacuum pressurization treatment machine, comprising a target plate mounted on a support so as to act as a cooler. The support is fastened to a frame that defines a closed space for positioning and centring the target.

The invention has set itself the goal of remedying these disadvantages in a simple, reliable, effective and rational way.

The problem that the invention sets out to solve is that of allowing quick and effective securing of the target, therefore allowing it to be demounted and remounted quickly, so that it can be replaced.

To solve such a problem, there has been developed a cathode for vacuum sputtering processing machine comprising a target plate mounted on a support designed to act as a cooler, characterized in that the support is secured to a frame delimiting a closed space for positioning and centring the target; the said frame peripherally has a profiled catching and interlocking rim able to collaborate with a set of independent gripping elements having complementary catching shapes able to allow an effect of tilting of the said elements resulting from a clamping action exerted on members engaged in the thickness of the elements, bearing against part of the catching rim of the frame, so that, under the said tilting effect, part of the catching shapes of the set of gripping elements bears facially against the peripheral edge of the target in order to secure it.

To solve the set problem of allowing reliable and effective securing of the target, the set of gripping elements is suitably cut out to form, once they have been assembled side by side, a closed peripheral frame surrounding and completely enclosing the four sides of the target, thereby delimiting a free centred region for sputtering.

Given the specific profile section of the catching shapes and the need to be able to replace the target quickly, the gripping elements or some of the elements have at least one mitred edge to form the corners while others are straight to be inserted by slipping between two corner elements in particular, those having already been positioned with respect to the frame.

To solve the set problem of allowing the gripping elements to tilt under the clamping effect, the members are set screws.

To solve the set problem of allowing the target to be secured under the effect of tilting of the clamping elements, the catching and interlocking rims of the frame consist of an offset straight profile section delimiting a straight slot. The complementary catching shapes of the gripping elements consist of a straight flute collaborating with the offset straight profile section and delimiting a nib collaborating with the slot to give rise to the tilting effect under the clamping action.

Another problem that the invention sets out to solve is that of being able easily to operate on the cathode assembly, particularly in order to change the sputtering target.

To solve such a problem, the support is mounted on a part of the machine designed to be easily extractable.

Advantageously, the relevant part of the machine constitutes a door.

The invention is explained in more detail hereinafter using the figures of the attached drawings in which.

Figure 3:
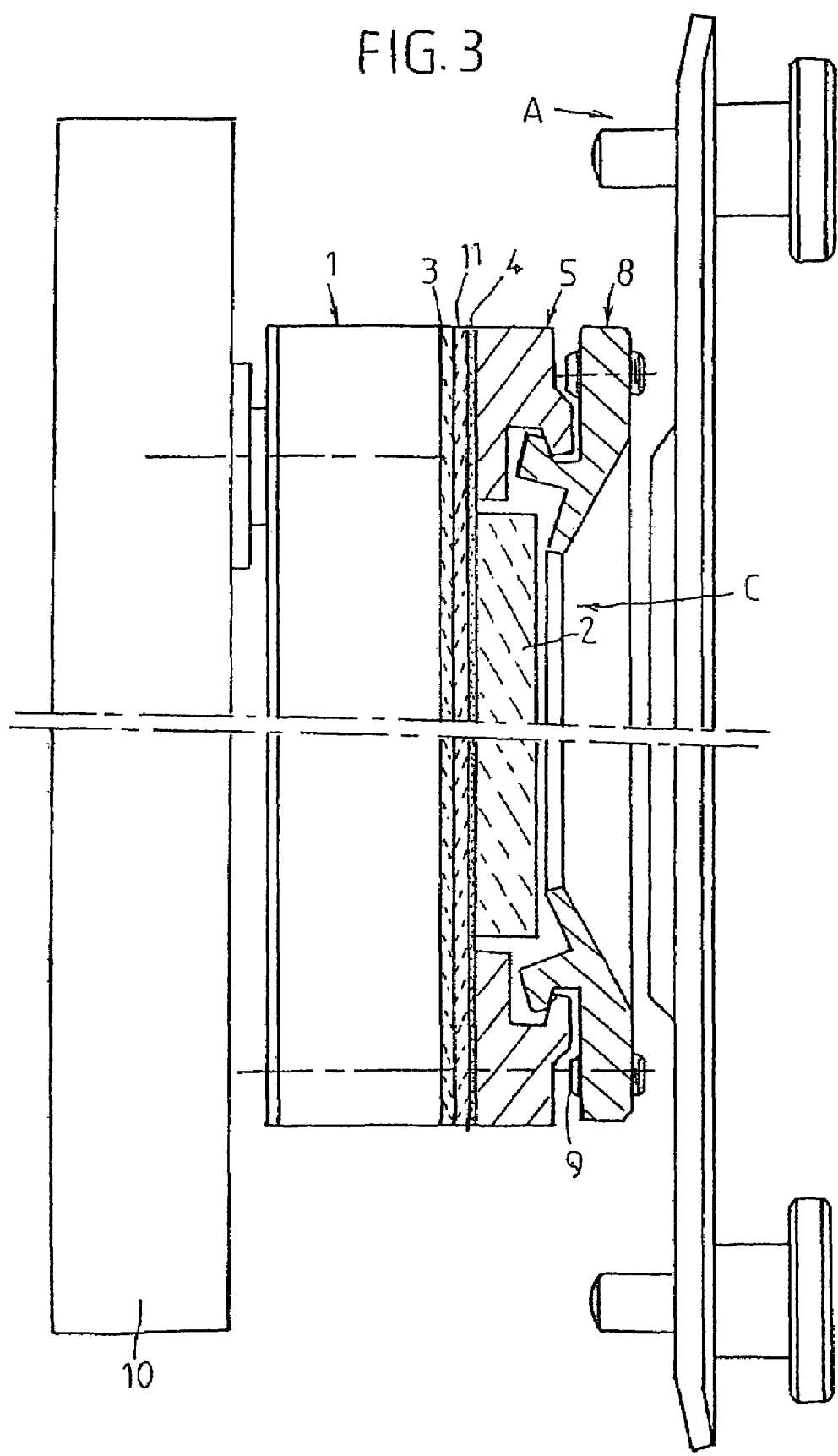
FIG. 3 is a view in section illustrating the embodiment and application of the cathode to the clamping of the target.
Figure 4:
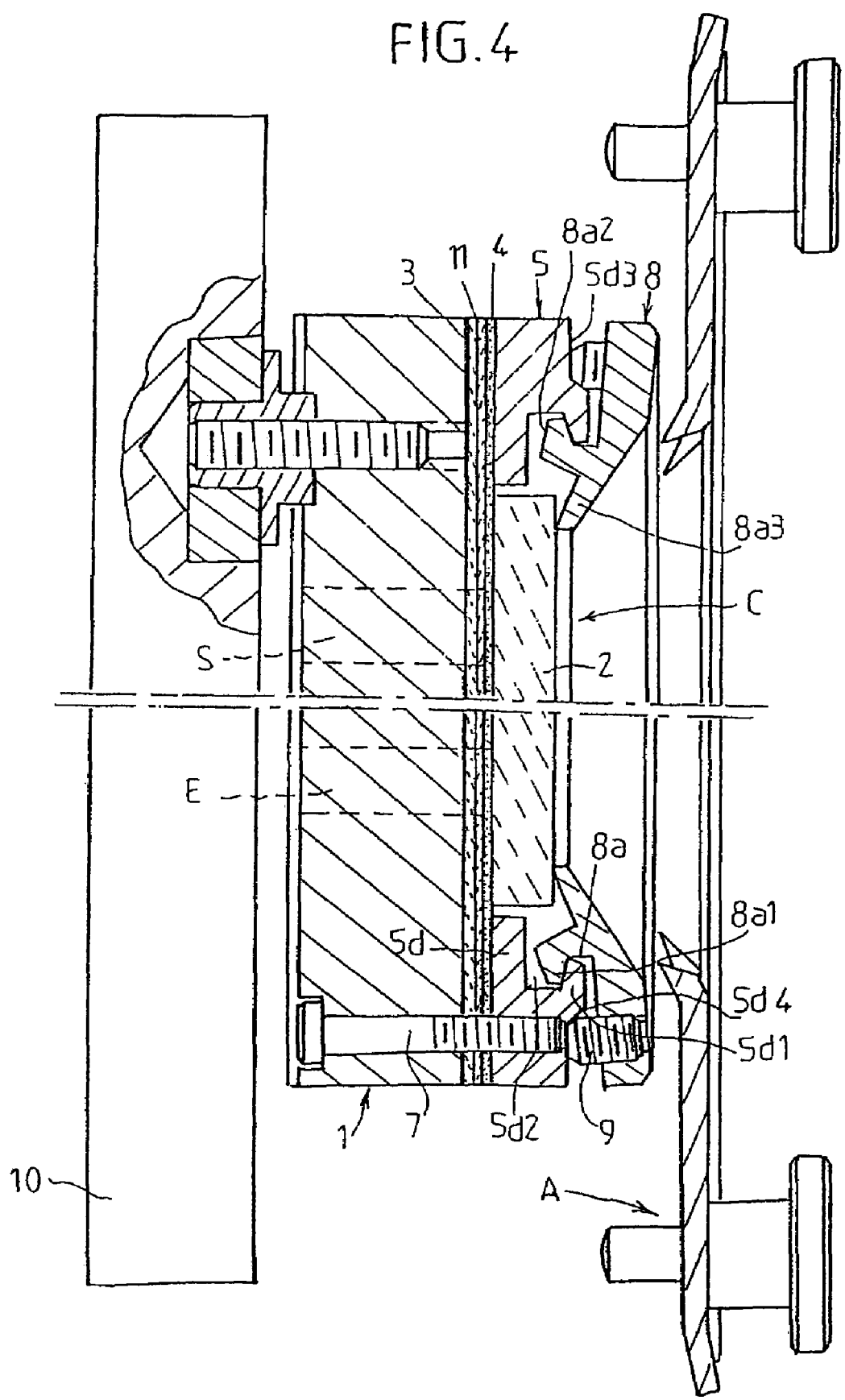
FIG. 4 is a view corresponding to FIG. 3 for the clamping of the target.

As FIGS. 3 and 4 show, the cathode finds a particularly advantageous application, although this cannot be taken to be limiting, in vacuum sputtering processing. These figures very schematically show the cathode denoted overall by (C) secured to an end plate (1) for example. The part of the machine under vacuum that acts as an anode is denoted (A).

The cathode (C) has a sputtering target (2) of any known and appropriate type suited to the processing that is to be carried out. This target (2) is mounted on a support (3) designed to act as a cooler. In the example illustrated, which must not be considered as being limiting, the support (3) has a membrane and has an inlet (E) and an outlet (S) for a cooling fluid. The membrane of the support is denoted (4).

According to the invention, the membrane support (3)–(4) is attached to a frame (5) delimiting a closed space (6) for the positioning and centring of the target (2). For example, when the target (2) has a rectangular overall shape, the frame (5) can be made from four straight profile sections (5A) (5B) (5C) (5D) cut and assembled to form a closed frame. The frame (5) thus produced is fixed for example using screws (7) into the thickness of the membrane support (3)–(4) and the end plate (1).

The frame (5) peripherally has a profiled catching and interlocking rim (5d) designed to collaborate with a set of gripping elements (8) having complementary catching shapes (8a).

The catching profiles (5d) and the complementary shapes (8a) are shaped in terms of cross section to allow an effect of tilting of the griping elements (8) as a result of a clamping action exerted on members (9) engaged in the thickness of the said elements (8) and bearing on part of the catching rim of the frame (7). Under the tilting effect, part of the catching shapes (8a) of the set of gripping elements (8) bears facially against the peripheral edge of the target (2) in order to secure it as indicated below.

Figure 5:
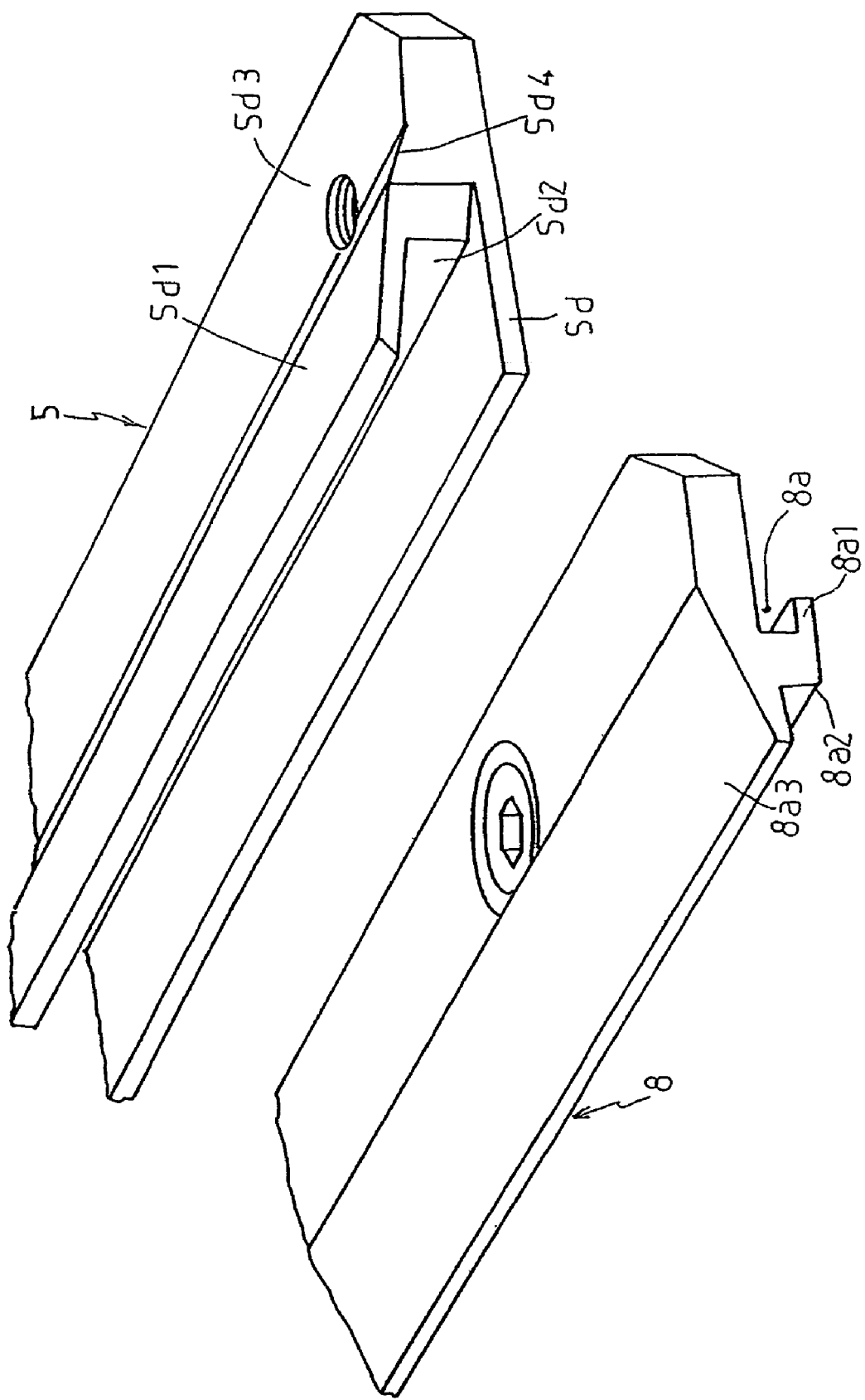
FIG. 5 is a perspective part view showing the cross-sectional profiles of the member support and of the gripping elements.

FIG. 5 shows an advantageous embodiment of the cross-sectional profile of the catching rim (5d) of the frame (5) and the complementary catching shapes (8a) of the griping elements (8).

The catching and interlocking rim (5d) consists of an offset straight profile section (5d1) delimiting a straight slot (5d2). The straight profile section (5d1) is connected to a bearing face (5d3) by an inclined face (5d4).

The complementary shapes of the gripping elements (8) consist of a straight flute (8a1) designed to be engaged over the offset straight profile section (5d1) of the frame (5). The straight flute (8a1) delimits a nib (8a2) collaborating with a slot (5d2). The nib (A2) is made to project beyond an inclined bearing face (8a3) designed to collaborate with the peripheral rim of the target (2).

When the cross section of the gripping elements (8) has been fitted into the catching and interlocking profile sections of the frame (5) (engagement of the nib (8a2) in the slot (5d2) of the profile section (5d) in the flute (8a1)), all that remains to be done is for the members (9) to be operated in order to create the effect of tilting of the gripping elements (8). With this in mind, the members (9) consist of set screws integrated into the thickness of the elements (8), under the catching shapes (8a), and bearing on the inclined connecting face (5d4) of the frame (5).

FIG. 3 shows the elements (8) before the set screws (9) are tightened, while FIG. 4 shows the elements (8) after the said set screws (9) have been tightened. It can be seen that after the tightening and therefore clamping action, the inclined face (8a3) bears against the peripheral edge of the target (2).

Figure 1:
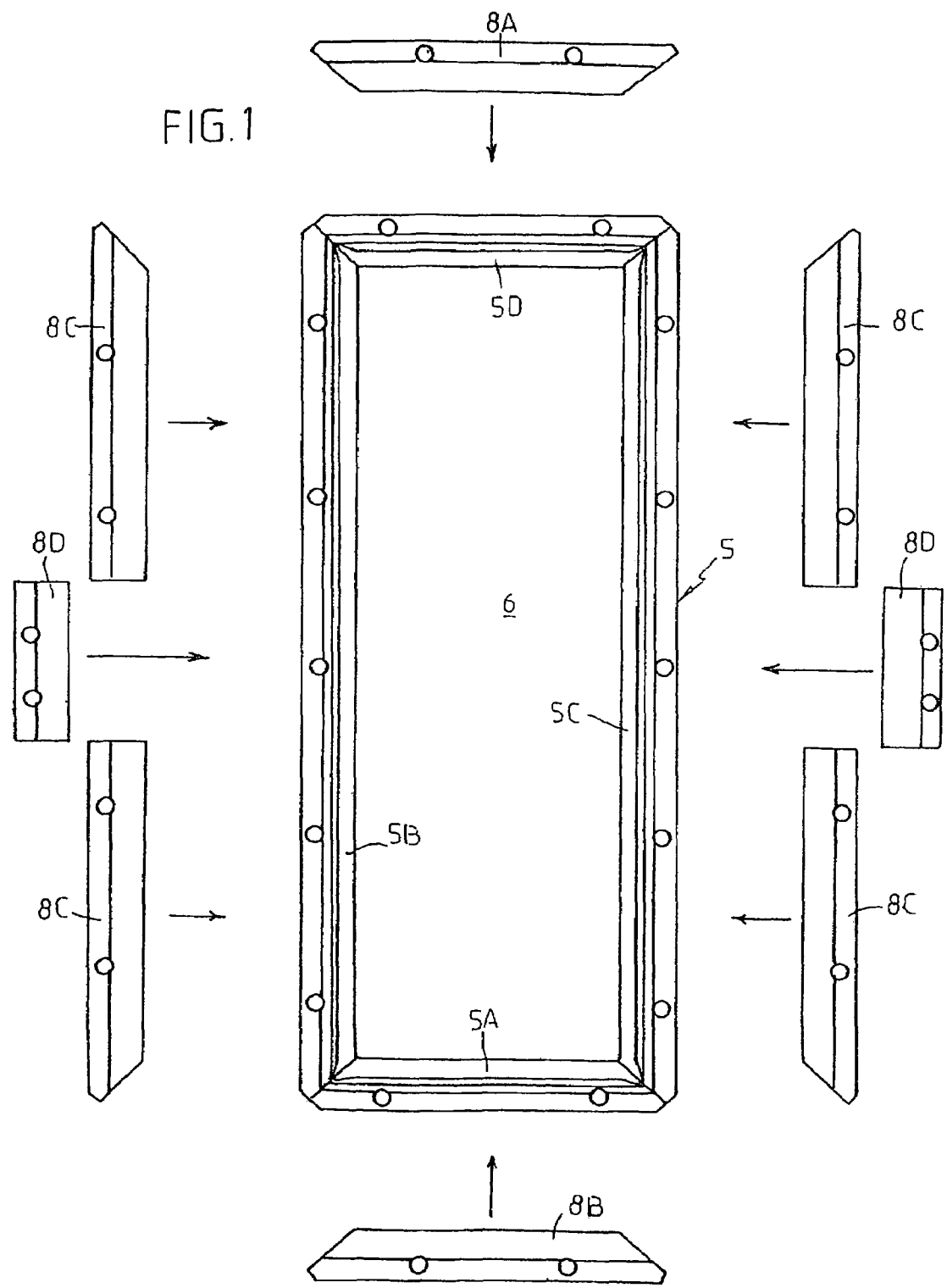
FIG. 1 is a plan view of part of a sputtering cathode, prior to the fitting of the gripping elements for securing the target.
Figure 2:
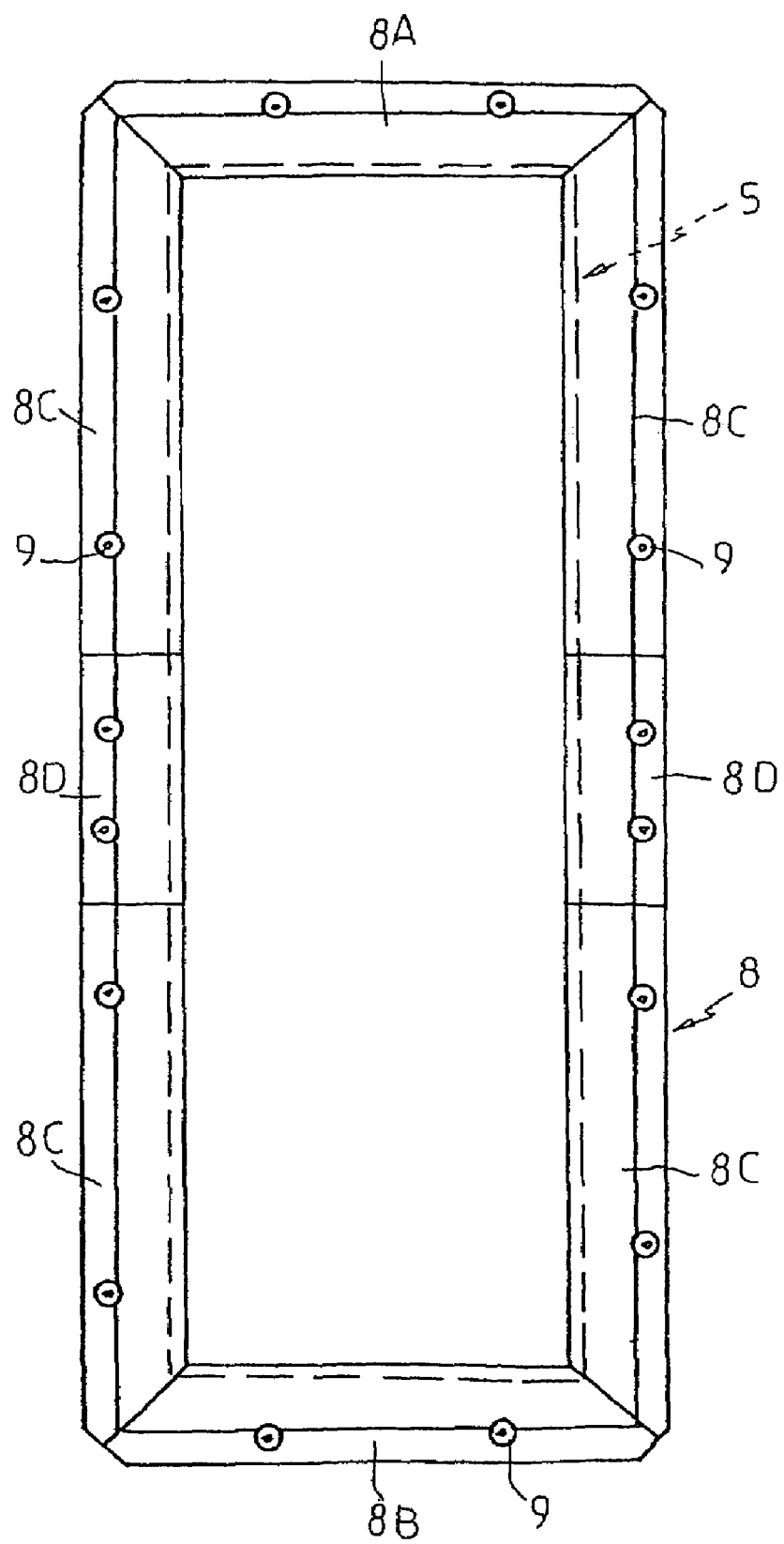
FIG. 2 is a view corresponding to FIG. 1 after the fitting of the gripping elements.

As FIGS. 1 and 2 show, the gripping elements (8) are suitably cut out to form, once they have been assembled side by side, a closed peripheral frame surrounding and completely enclosing the 4 sides of the target (2), thereby delimiting a free centred region for sputtering. In other words, after assembly, the elements (8) reproduce the same geometric shape as the frame (5).

Given the imbrication of the shapes of the catching profile sections of the elements (8) and of the frame (5), the various elements (8) are independent of one another. Some have at least one mitred edge to form the corners, while others are straight to be inserted by slipping between two elements in particular, these having already been positioned with respect to the frame (5).

Considering the example illustrated in FIGS. 1 and 2, the gripping elements (8) consist of two elements (8A) and (8B) corresponding to the two short sides of the frame, these two elements (8A)(8B) being mitred at each of their ends, of four elements (8C) mitred at one of their ends, to be positioned in relation with the elements (8A) and (8B) and finally of two elements (8D) intended to be inserted after the mounting of two elements (8C) considered on the same side of the frame.

Given these arrangements, it is apparent that the mounting and demounting of the target (2) is particularly simple and quick. Indeed, all that is required is for the gripping elements (8) to be demounted by slackening the set screws (9).

Likewise, the fitting of a new target (2) can be done very quickly. Having positioned it inside the frame (7) all that remains to be done is for the gripping elements (8) to be returned to their positions, as indicated, and for the set screws (9) to be tightened to cause the said elements (8) to tilt (FIG. 4). It is therefore apparent that it is the mating profile sections of the gripping elements (8) and of the frame (5) that secure the target, rather than clamping screws.

According to one important feature of the invention, the cathode assembly as defined according to the characteristics of the invention is mounted on the end plate (1), on part of the machine designed to be easily extractable. This part of the machine may advantageously consist of a door (10).

It must be noted that the gripping elements (8) may or may not be made of the same material as the sputtering target.

The advantages are clearly evident from the description.

The invention claimed is:

1. Cathode for vacuum sputtering processing machine comprising a target plate mounted on a support comprising a cooler, the support is secured to a frame delimiting a closed space for positioning and centering the target plate wherein the frame peripherally has a profiled catching rim configured to collaborate with a set of independent gripping elements having complementary catching shapes configured to allow an effect of tilting of the elements resulting from a clamping action exerted on members engaged in a thickness of the elements, and bearing against a part of the catching rim of the frame, so that, under the tilting effect, a part of the catching shapes of the set of gripping elements bears facially against a peripheral edge of the target plate to secure the target plate.

2. Cathode according to claim 1, wherein the set of gripping elements is suitably cut out to form, once they have been assembled side by side, a closed peripheral frame surrounding and completely enclosing the four sides of the target, thereby delimiting a free centered region for sputtering.

3. Cathode according to claim 2, wherein a first plurality of the elements has at least one mitred edge to form corners and a second plurality of the elements is straight to allow each of the second plurality to be inserted by slipping between two receiving corners of the corners already positioned with respect to the frame.

4. Cathode according to claim 1, wherein the members are set screws.

5. Cathode according to claim 1, wherein the catching rim of the frame comprises an offset straight profile section delimiting a straight slot.

6. Cathode according to claim 1, wherein the complementary catching shapes of the gripping elements consist of a straight flute collaborating with an offset straight profile section of the frame and delimiting a nib collaborating with the slot to give rise to the tilting effect under the clamping action.

7. Cathode according to claim 1, wherein the support has a membrane.

8. Cathode according to claim 1, wherein the support is mounted on a part of the machine, which is easily extractable.

9. Cathode according to claim 8, wherein the part of the machine constitutes a door.

10. Cathode according to claim 1, wherein the gripping elements comprise a same material or a different material as the sputtering target.

11. Cathode according to claim 5, wherein the complementary catching shapes of the gripping elements consist of a straight flute collaborating with an offset straight profile section of the frame and delimiting a nib collaborating with the slot to give rise to the tilting effect under the clamping action.

* * * * *